United States Patent
Gattami

(10) Patent No.: US 10,021,548 B2
(45) Date of Patent: Jul. 10, 2018

(54) CODING AND FILTERING FOR MACHINE-TYPE COMMUNICATION

(71) Applicant: Telefonaktiebolaget LM Ericsson (publ), Stockholm (SE)

(72) Inventor: Ather Gattami, Stockholm (SE)

(73) Assignee: Telefonaktiebolaget LM Ericsson (publ) (SE)

( * ) Notice: Subject to any disclaimer, the term of this patent is extended or adjusted under 35 U.S.C. 154(b) by 105 days.

(21) Appl. No.: 15/036,740

(22) PCT Filed: Aug. 15, 2014

(86) PCT No.: PCT/SE2014/050941
§ 371 (c)(1),
(2) Date: May 13, 2016

(87) PCT Pub. No.: WO2015/072904
PCT Pub. Date: May 21, 2015

(65) Prior Publication Data
US 2016/0277870 A1    Sep. 22, 2016

Related U.S. Application Data

(60) Provisional application No. 61/904,504, filed on Nov. 15, 2013.

(51) Int. Cl.
*H04W 8/00* (2009.01)
*H04W 4/70* (2018.01)
(Continued)

(52) U.S. Cl.
CPC .................. *H04W 4/70* (2018.02); *H04L 1/12* (2013.01); *H04L 25/0242* (2013.01);
(Continued)

(58) Field of Classification Search
CPC ........ H04W 4/00; H04W 4/005; H04L 25/02; H04L 25/0242; H04L 25/0258
See application file for complete search history.

(56) References Cited

U.S. PATENT DOCUMENTS

2004/0209624 A1 * 10/2004 Rune ..................... H04W 28/08
455/453

OTHER PUBLICATIONS

3GPP, "Updated SID on: Provision of low-cost MTC UEs based on LTE", TSG RAN meeting #57 RP-121441, Vodafone, Chicago, USA, Sep. 4-7, 2012, 1-6.

(Continued)

*Primary Examiner* — Anez Ebrahim
(74) *Attorney, Agent, or Firm* — Murphy, Bilak & Homiller, PLLC

(57) ABSTRACT

Encoding and decoding schemes at an encoding device/transmitter and decoder device/receiver, respectively, for use in communicating the state of a system. In an example method carried out by an encoding device, state information x(k), which represents the current state of a monitored system, is measured. The encoding device calculates a state update parameter, based on: a message power constraint P; the covariance N of measurement noise associated with the channel over which encoded state information is to be transmitted; and the norm of the signal vector [s(k), x(k)], where s(k) is a stored state information parameter. The encoding device then calculates a message signal z(k)= G(k)*(x(k)−s(k)), which may then be transmitted to a remote decoder device, and calculates an updated version of the stored information s(k+1)=A*(s(k)+F(k)*z(k)). The encoding device replaces the stored state information s(k) with s(k+1).

25 Claims, 6 Drawing Sheets

(51) Int. Cl.
  *H04L 1/12* (2006.01)
  *H04L 25/02* (2006.01)
  H03H 17/02 (2006.01)
  H03H 21/00 (2006.01)

(52) U.S. Cl.
  CPC ..... *H04L 25/0258* (2013.01); *H03H 17/0257* (2013.01); *H03H 21/003* (2013.01)

(56) References Cited

OTHER PUBLICATIONS

Gattami, Ather, "Distributed Estimation and Control under Partially Nested Pattern", 2009 American Control Conference, WeB06.3, St. Louis, Missouri, Jun. 10-12, 2009, 866-871.

Hespanha, Joao et al., "A Survey of Recent Results in Networked Control Systems", Proceedings of the IEEE, vol. 95, No. 1, Jan. 2007, 138-162.

Johannesson, Erik et al., "Encoder and Decoder Design for Signal Estimation", 2010 American Control Conference, WeC16.4, Baltimore, Maryland, Jun. 30-Jul. 2, 2010, 2132-2137.

* cited by examiner

CODING AND FILTERING FOR MACHINE-TYPE COMMUNICATION

TECHNICAL FIELD

The present disclosure relates generally to wireless communication systems, and more specifically relates to signal coding for messages that encode the state of a dynamical system.

BACKGROUND

The 3rd Generation Partnership Project (3GPP) is responsible for the standardization of the Universal Mobile Telecommunication System (UMTS) and the fourth-generation wireless system commonly known as Long Term Evolution (LTE). The 3GPP work on LTE is also referred to as Evolved Universal Terrestrial Access Network (E-UTRAN). LTE is a technology for realizing high-speed packet-based communication that can reach high data rates both in the downlink and in the uplink, and is thought of as a next generation mobile communication system, relative to UMTS. In order to support high data rates, LTE allows for a system bandwidth of 20 MHz, or up to 100 Hz when carrier aggregation is employed. LTE is also able to operate in different frequency bands and can operate in at least Frequency Division Duplex (FDD) and Time Division Duplex (TDD) modes.

In a future "Networked Society" scenario there are expected to be a very large number of machine-type-communication (MTC) devices supported by wide-area wireless networks. Many of these devices will transmit a small amount of uplink data, e.g., 100 bits or so, very infrequently, e.g., once per hour.

Some MTC devices may be installed in locations that are inaccessible to or only occasionally used by people, and which may not have robust coverage from traditional wireless networks. 3GPP, in its continuing standardization of technology for LTE, plans to introduce a new solution for "enhanced MTC coverage," with a goal of improving the link budget under enhanced MTC coverage by approximately 15-20 dB, compared to what is supported with the legacy LTE standard. (See, for example, 3GPP Tdoc RP-121441, available at http://www.3gpp.org/ftp/tsg_ran/TSG_RAN/TSGR_57//Docs/.) This is expected to make LTE even more attractive for MTC type of solutions.

Machine-to-machine (M2M) communication, also known as machine-type communication (MTC), is used for establishing communication between machines and between machines and humans. The communication may comprise an exchange of data, signaling, measurement data, configuration information, etc. The device sizes may vary from that of a wallet to that of a base station. M2M devices are quite often used for applications like sensing environmental conditions (e.g., temperature reading), metering or measurement (e.g., electricity usage, etc.), fault finding or error detection, etc. In these applications, the M2M devices are active very infrequently, but over a particular duration that depends upon the type of service, e.g., about 200 milliseconds once every 2 seconds, about 500 milliseconds every 60 minutes, etc.

Machine-type-communication (MTC) involves the monitoring of dynamical systems in many cases, such as vehicle-to-vehicle communications, industrial control applications, and machine-to-machine communications. The communication involved in these applications generally includes messaging of the current state of the monitored system, which is dynamical, i.e., changing in time.

The current state in a dynamical system is dependent on the past states. As a result, knowledge about past states for the system can be used to improve an estimate of the current state. Generally, more information regarding the system's past states allows more accurate estimation of the system's present state. However, due to memory limitations, it is often desired that only a small portion of the system's entire state history is stored. This may be a particular issue in MTC applications, where the resources of a given device may be limited.

The dynamical nature of the systems monitored in MTC applications may be exploited to improve the encoding and decoding of the messages sent to indicate the systems' current states. Encoding and decoding techniques that do this while using as little memory as possible for storing prior state information are needed.

SUMMARY

Embodiments of the presently disclosed techniques include new encoding and decoding schemes at an encoding device/transmitter and decoder device/receiver, respectively, for use in communicating the state of a dynamical system. With these new schemes, the complexity of the algorithm is constant, and thus independent of the size of the time horizon K. Also, the memory needed for the encoder is fixed and is equal to the size of the state x(k). Likewise, the memory of the decoder is also constant and equal to the size of x(k). One example method is carried out by an encoding device, which might be found in a transmitter device such as an MTC device. The encoding device receives measured state information x(k), which represents the current state of a monitored system. The encoding device calculates a state update parameter, based on: a message power constraint P; the covariance N of measurement noise associated with the channel over which encoded state information is to be transmitted; and the norm of the signal vector [s(k), x(k)], where s(k) is a stored state information parameter. In some embodiments, the norm is computed according to sigma(k)= $\sqrt{(V11(k)-2*V12(k)+V22(k))}$, where $$\begin{bmatrix} V11(k) & V12(k) \\ V12(k) & V22(k) \end{bmatrix}$$

is the covariance matrix for the signal vector [s(k), x(k)]. In these embodiments, the state update parameter may be computed according to parameter F(k)=sigma(k)*$\sqrt{P}$/(P+N). The encoding device also calculates a gain parameter G(k), as a function of the message power constraint P and the norm of (x(k)−s(k)).

The encoding device then calculates a message signal z(k)=G(k)*(x(k)−s(k)), which may then be transmitted to a remote decoder device, and calculates an updated version of the stored information s(k+1)=A*(s(k)+F(k)*z(k)). The encoding device replaces the stored state information s(k) with s(k+1) when an acknowledgment is obtained from the remote decoder device that the transmitted message has been successfully decoded.

A corresponding method is carried out by a decoder device, such as might be found in a receiver device such as a base station. The decoder device measures the (delayed) output y(k−1) obtained by a signal receiver, and calculates a state update parameter F(k) in the same manner described above for the encoding device. The decoder device then calculates a state estimate from a stored state estimate and the state update parameter, e.g., according to $\hat{x}(k)=A*(\hat{x}(k-1)+F(k)*y(k-1))$. The decoder device replaces the stored state estimate $\hat{x}(k-1)$ with the newly computed, most recent, state estimate $\hat{x}(k)$, and may send an acknowledgement to the encoding device when the message has been successfully decoded.

BRIEF DESCRIPTION OF THE DRAWINGS

Further objects, features, and advantages of the present disclosure will become apparent from the following detailed description taken in conjunction with the accompanying Figures showing illustrative and/or exemplary embodiments, in which.

DETAILED DESCRIPTION

Figure 1:
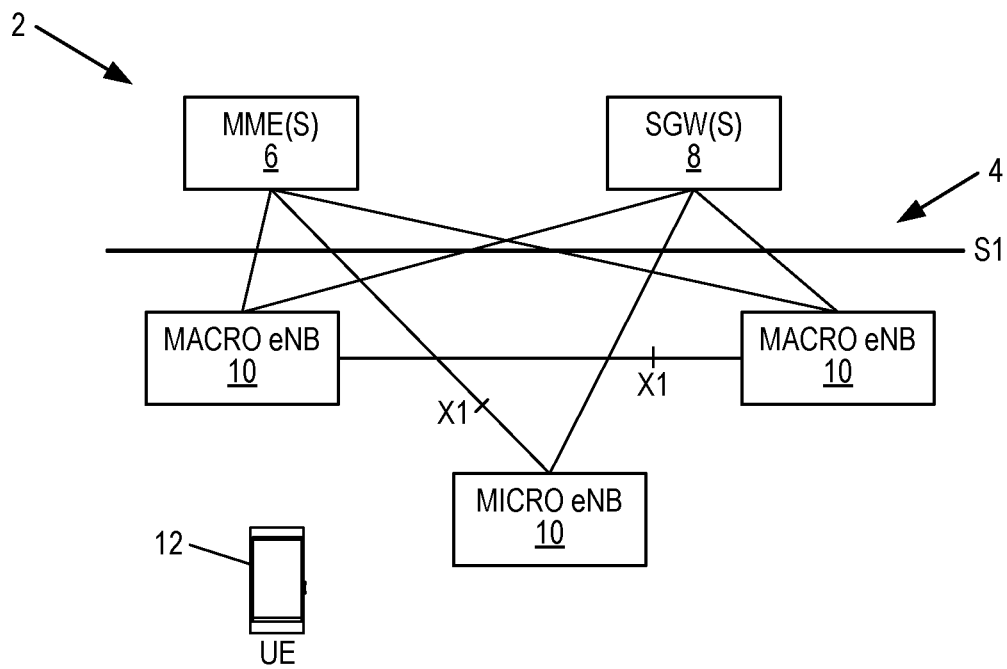
FIG. 1 shows an example diagram of an E-UTRAN architecture, as part of an LTE-based communications system.

In the discussion that follows, specific details of particular embodiments of the presently disclosed techniques and apparatus are set forth for purposes of explanation and not limitation. It will be appreciated by those skilled in the art that other embodiments may be employed apart from these specific details. Furthermore, in some instances detailed descriptions of well-known methods, nodes, interfaces, circuits, and devices are omitted so as not to obscure the description with unnecessary detail. Those skilled in the art will appreciate that the functions described may be implemented in one or in several nodes.

Some or all of the functions described may be implemented using hardware circuitry, such as analog and/or discrete logic gates interconnected to perform a specialized function, ASICs, PLAs, etc. Likewise, some or all of the functions may be implemented using software programs and data in conjunction with one or more digital microprocessors or general purpose computers. Where nodes that communicate using the air interface are described, it will be appreciated that those nodes also have suitable radio communications circuitry. Moreover, the technology can additionally be considered to be embodied entirely within any form of computer-readable memory, including non-transitory embodiments such as solid-state memory, magnetic disk, or optical disk containing an appropriate set of computer instructions that would cause a processor to carry out the techniques described herein.

Hardware implementations may include or encompass, without limitation, digital signal processor (DSP) hardware, a reduced instruction set processor, hardware (e.g., digital or analog) circuitry including but not limited to application specific integrated circuit(s) (ASIC) and/or field programmable gate array(s) (FPGA(s)), and (where appropriate) state machines capable of performing such functions.

In terms of computer implementation, a computer is generally understood to comprise one or more processors or one or more controllers, and the terms computer, processor, and controller may be employed interchangeably. When provided by a computer, processor, or controller, the functions may be provided by a single dedicated computer or processor or controller, by a single shared computer or processor or controller, or by a plurality of individual computers or processors or controllers, some of which may be shared or distributed. Moreover, the term "processor" or "controller" also refers to other hardware capable of performing such functions and/or executing software, such as the example hardware recited above.

References throughout the specification to "one embodiment" or "an embodiment" mean that a particular feature, structure, or characteristic described in connection with an embodiment is included in at least one embodiment of the present invention. Thus, the appearance of the phrases "in one embodiment" or "in an embodiment" in various places throughout the specification are not necessarily all referring to the same embodiment. Further, the particular features, structures or characteristics may be combined in any suitable manner in one or more embodiments.

While the following examples are described in the context of LTE systems, the principles described in the following disclosure may be equally applied to other cellular networks. Likewise, it should be understood that while the specific encoding and decoding techniques described herein are explained in the context of MTC devices and may be particularly beneficial for MTC applications, these techniques are more generally applicable to other types of devices, including wireless devices, where it is necessary or useful to transmit a series of messages that encode the changing state of a dynamical system.

FIG. 1 shows an example diagram of an E-UTRAN architecture, as part of an LTE-based communications system 2. Nodes in the core network 4 include one or more Mobility Management Entities (MMEs) 6, which are control nodes for the LTE access network, and one or more Serving Gateways (SGWs) 8, which route and forward user data packets while acting as mobility anchors. The MMEs 6 and SGWs 8 communicate with base stations 10 referred to in LTE as eNBs, over interfaces specified by the 3GPP standards, such as the S1 interface. The eNBs 10 can include two or more of the same or different categories of eNBs, e.g., macro eNBs, and/or micro/pico/femto eNBs. The eNBs 10 communicate with one another over an interface, for example an X2 interface. The S1 interface and X2 interface are defined in the LTE standard. A UE 12 can receive downlink data from and send uplink data to one of the base stations 10 with that base station 10 being referred to as the serving base station of the UE 12. It should be appreciated that while the techniques described herein may be applied in the context of an E-UTRAN network, e.g., as illustrated in FIG. 1, the techniques may also be applied in other network contexts, including in UTRA networks, or in peer-to-peer communications, such as in an ad-hoc network or in a so-called device-to-device scenario.

In some of the embodiments described herein, the non-limiting terms "user equipment" and "UE" are used. A UE, as that term is used herein, can be any type of wireless device capable of communicating with a network node or another UE over radio signals, including an MTC device or M2M device. A UE may also be referred to as a radio communication device, or a target device, and the term is intended to include device-to-device UEs, machine-type UEs or UEs capable of machine-to-machine communication, sensors equipped with a UE, wireless-enabled table computers, mobile terminals, smart phones, laptop-embedded equipped (LEE), laptop-mounted equipment (LME), USB dongles, wireless customer-premises equipment (CPE), etc. In the discussion that follows, the terms M2M device, MTC device, wireless sensor, and sensor are used interchangeably. It should be understood that these devices are UEs, but are generally configured to transmit and/or receive data without direct human interaction. The term "wireless node," as used herein may be understood to more generally refer to wireless devices, UEs, MTC devices, and the like, as well as wireless base stations, access points, etc.

Figure 2:
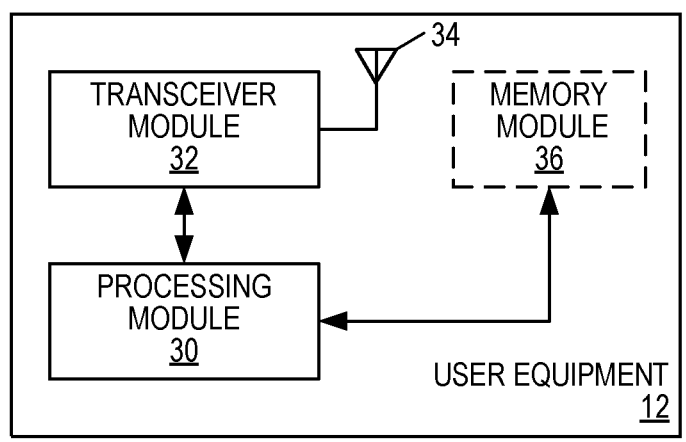
FIG. 2 shows an exemplary user equipment (UE) usable in one or more exemplary embodiments of the present disclosure.

FIG. 2 shows a user equipment (UE) 12 that can be used in one or more of the non-limiting example embodiments described. The UE 12 may in some embodiments be a mobile device that is configured for machine-to-machine (M2M) or machine-type communication (MTC), i.e., an MTC device. The UE 12 comprises a processing module 30 that controls the operation of the UE 12. The processing module 30, which may comprise one or more microprocessors, microcontrollers, digital signal processors, specialized digital logic, etc., is connected to a receiver or transceiver module 32 with associated antenna(s) 34 which are used to receive signals from and/or to transmit signals to a base station 10 in the network 2. The user equipment 12 also comprises a memory module 36 that is connected to the processing module 30 and that stores program code and other information and data required for the operation of the UE 12. Together, the processing module and memory module may be referred to as a "processing circuit," and are adapted, in various embodiments, to carry out one or more of the UE-based techniques described below.

More specifically, in an MTC scenario, the UE 12 may be configured to carry out one or more of the techniques described below for encoding the state of a monitored system and transmitting the resulting message to a remote receiver, e.g., in a NodeB. However, a UE 12 may also be configured to carry out the techniques described below for decoding the state of a monitored system from a received message, which may be received from, for example, another wireless device or a base station. Some UEs may be configured to carry out both techniques.

Also, in the description of some embodiments below, the generic terminology "radio network node" or simply "network node (NW node)" is used. These terms refer to any kind of wireless network node, such as a base station, a radio base station, a base transceiver station, a base station controller, a network controller, an evolved Node B (eNB), a Node B, a relay node, a positioning node, a E-SMLC, a location server, a repeater, an access point, a radio access point, a Remote Radio Unit (RRU) Remote Radio Head (RRH), a multi-standard radio (MSR) radio node such as MSR BS nodes in distributed antenna system (DAS), a SON node, an O&M, OSS, or MDT node, a core network node, an MME, etc.

Figure 3:
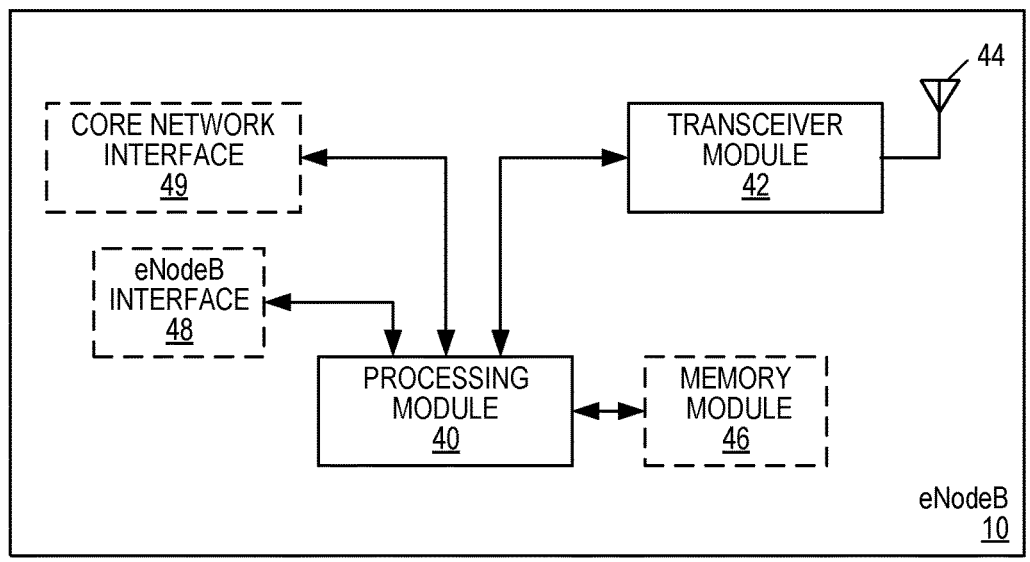
FIG. 3 shows an exemplary base station (e.g., NodeB, eNodeB, etc.) usable in one or more exemplary embodiments of the present disclosure.

FIG. 3 shows a base station 10 (for example a NodeB or an eNodeB) that can be used in example embodiments described. It will be appreciated that although a macro eNB will not in practice be identical in size and structure to a micro eNB, these different examples of base station 10 will generally include similar or corresponding components, although the details of each of those components may vary to accommodate the different operational requirements of a particular embodiment.

The illustrated base station 10 comprises a processing module 40 that controls the operation of the base station 10. The processing module 40, which may comprise one or more microprocessors, microcontrollers, digital signal processors, specialized digital logic, etc., is connected to a transceiver module 42 with associated antenna(s) 44, which are used to transmit signals to, and receive signals from, user equipments 12 in the network 2. The base station 10 also comprises a memory module 46 that is connected to the processing module 40 and that stores program and other information and data required for the operation of the base station 10. Together, the processing module 40 and memory module 46 may be referred to as a "processing circuit," and are adapted, in various embodiments, to carry out one or more of the network-based techniques described below.

More specifically, in an MTC scenario, the processing circuit of base station 10 may be configured to carry out all or part of one or more of the techniques described below for decoding the state of a monitored system from a message received from a remote transmitter, e.g., a UE. However, a base station 10 may also be configured to carry out the techniques described below for encoding the state of a monitored system for transmission to another device. Some base stations may be configured to carry out both techniques.

The base station 10 also includes components and/or circuitry 48 for allowing the base station 10 to exchange information with other base stations 10 (for example, via an X2 interface) and components and/or circuitry 49 for allowing the base station 10 to exchange information with nodes in the core network 4 (for example, via the S1 interface). It will be appreciated that base stations for use in other types of network (e.g., UTRAN or WCDMA RAN) will include similar components to those shown in FIG. 3 and appropriate interface circuitry 48, 49 for enabling communications with the other network nodes in those types of networks (e.g., for communications with other base stations, mobility management nodes and/or nodes in the core network).

In an MTC application, it is desirable to minimize the size and/or number of the messages transmitted from the MTC device to report the state of the monitored system. Furthermore, it is desirable to minimize the memory resources needed to support the application. Accordingly, the problem under consideration here is the design of a reliable encoding and decoding scheme, suitable for wireless transmission, which uses as small a memory as possible to communicate and estimate the system state.

Figure 4:
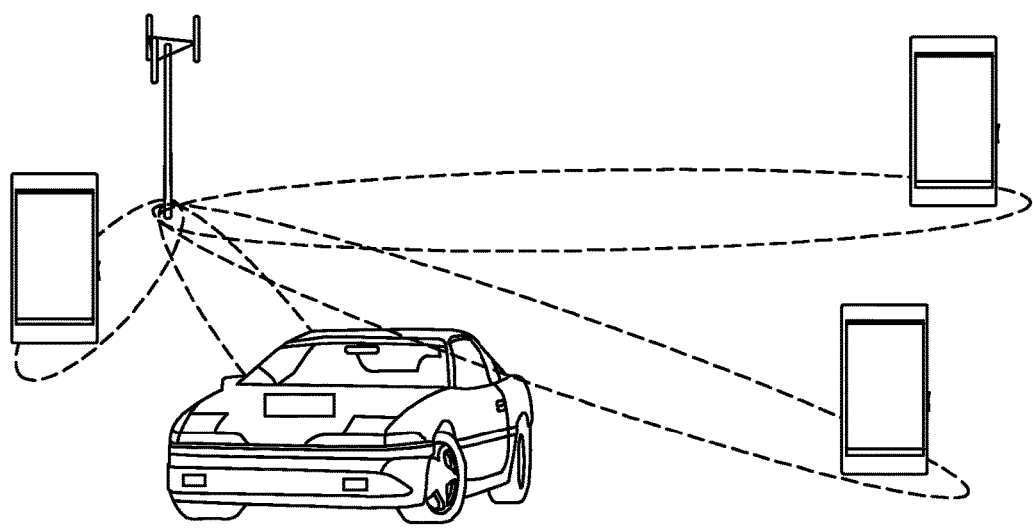
FIG. 4 illustrates an exemplary dynamic communication channel that can result from the movement of an object.

FIG. 4 illustrates an example of a dynamic, i.e., non-static, communication channel that results from the movement of an object, such as the automobile or mobile devices shown in the FIG. 4. In many scenarios, like a system described by a moving object, the state of the system can be represented by a linear dynamical system (or simply a linear filter). This dynamical system is described by $$x(k+1) = Ax(k) + Bw(k)$$

where x(k) represents the state of the system, w(k) is the input to the system, and A and B are scalars. A and B may or may not be constant over time.

An encoding and decoding system that takes into account this system state representation can be implemented. It is assumed that the scalars A and B are available to the encoder and decoder. At each time step k, the state at time k is obtained at the encoding end of the system (e.g., at an MTC device monitoring an industrial system.) The encoding of the system's current state depends on the state history. In other words, the encoding of the current state is a function g of the state history x(k), x(k−1), . . . , x(0). The resulting message, $$z(k)=g(x(k),x(k-1),\ldots,x(0)),$$

is subject to a power constraint and is transmitted, e.g., via an LTE network, to a desired receiver, which receives a corrupted version given by $$y(k)=z(k)+n(k)$$

where n(k) is white noise.

Given unlimited resources, the decoder at the receiving end of the transmission may have access to the entire history of the received messages y(k), y(k−1), . . . , y(0). The estimated value of the state x(k) is then given by $$\hat{x}(k)=f(y(k),y(k-1),\ldots,y(0))$$

The problem to be solved is the development of an encoder/decoder scheme that allows for efficient encoding of the state x(k), transmission of the resulting message, and decoding of the received message. More generally, the problem to be solved is the joint design of optimal linear encoders and decoders for filtering and transmission of a signal over a wireless communication link, subject to memory constraints with respect to the prior states of the system.

Previous designs undertaken from a theoretical perspective rely on the encoder storing the entire history of the transmitted messages z(k), z(k−1), z(0) and the decoder storing the entire history of the received messages y(k), y(k−1), . . . , y(0). The linear optimal encoder and decoder are obtained by solving a convex optimization problem (semi-definite program) that scales with the size of the time k. Note that this problem resembles the problem of Kalman filtering, with an important difference being that the measurement is obtained from a wireless channel where the encoder is part of the filter design.

One design is given by Johannesson et al., "Encoder and Decoder Design for Signal Estimation," 2010 American Control Conference, Baltimore, Md., USA, Jun. 30-Jul. 2, 2010, pp. 2132-2137. The method proposed therein requires an unlimited memory size, however, which is of course not realizable in practice. Also, the computation of the optimal encoder and decoder grows with the size of the memory (that is, with increasing time). Hence, the computational complexity also grows without limit, which is indeed problematic because of the increasing number of iterations.

Embodiments of the presently disclosed techniques include new encoding and decoding schemes at an encoder/transmitter device and decoder/receiver device, respectively, where the complexity of the algorithm is constant, and thus independent of the size of the time horizon k. Also, the memory needed for the encoder is fixed and is equal to the size of the state x(k). Likewise, the memory of the decoder is also constant and equal to the size of x(k). Note that the terms "transmitter device" and "receiver device" are used herein to refer to the devices that instantiate the encoder and decoder, respectively, which can likewise be referred to as "encoding devices" and "decoding devices." A particular device, such as an MTC device, might include both, in which case that device would be both a "transmitter device" and "receiver device," as those terms are used herein.

Figure 5:
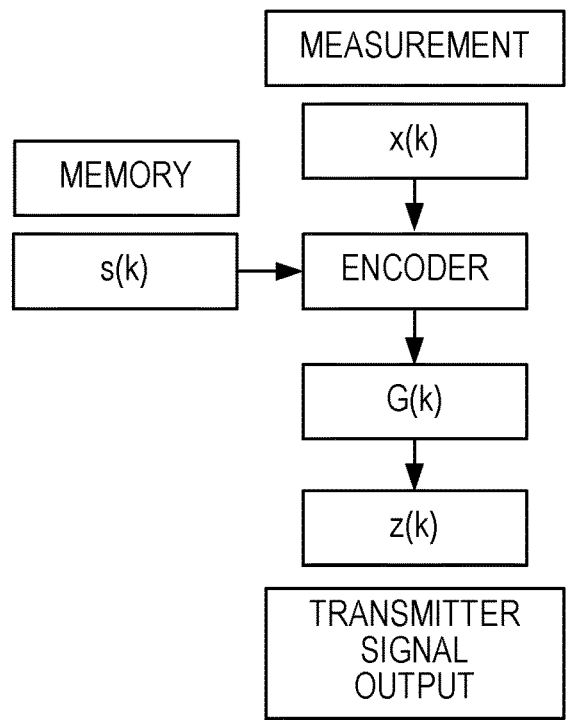
FIG. 5 illustrates a signal flow through an exemplary encoder according to one or more exemplary embodiments of the present disclosure.
Figure 6:
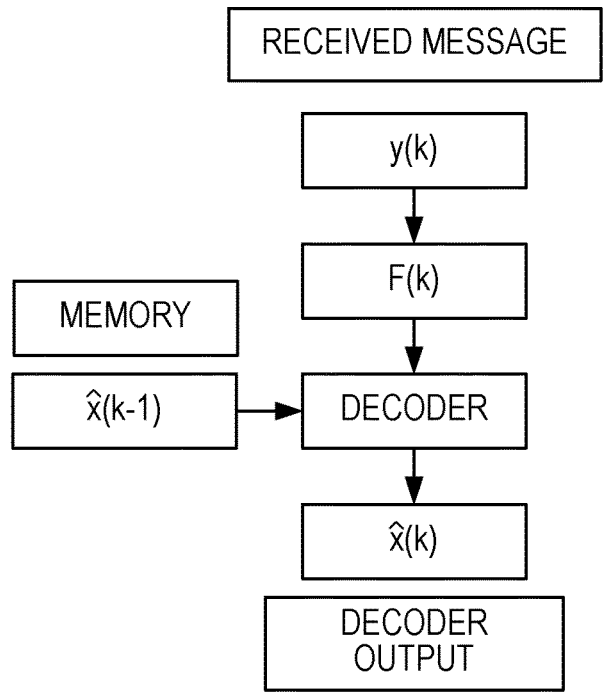
FIG. 6 illustrates a signal flow through an exemplary decoder according to one or more exemplary embodiments of the present disclosure.

The signal flow diagrams in FIGS. 5 and 6 illustrate the incoming and outgoing signals of the encoder and decoder, respectively.

FIG. 5 shows a signal diagram over the encoder. A measurement x(k) may be produced from sensors or other measurement devices included in the encoder/transmitter device itself, or from measurement equipment in a separate monitoring device, or from some intermediary signal. The encoder receives the measurement x(k) of the current state, which is combined with the memory value s(k) that has been stored, to produce the signal x(k)−s(k). This signal is then normalized by a calculated gain G(k) in order for the resulting transmitted message z(k) to satisfy a given power constraint.

FIG. 6 shows a signal diagram over the corresponding decoder. The decoder receives y(k), which is the corrupted measurement of the transmitted message z(k); y(k)=z(k)+w(k).

The decoder calculates F(k) and F(k)*y(k), and then calculates the best estimate $\hat{x}(k)$ of x(k) based on its previous estimate $\hat{x}(k-1)$ and F(k)*y(k).

The encoding and decoding process assumes that certain parameters are known at both the transmitter device and receiver device, and are thus available to the encoder and decoder, respectively. These include:

The parameters A, B, of the linear system x(k+1)=Ax(k)+Bw(k).

The covariance N of the measurement noise n(k).

The power constraint on the transmitted message z(k), which is given by P.

The time horizon K.

These parameters may be communicated from one device to the other or otherwise agreed upon, using conventional means.

The encoding and decoding of a message that conveys the state of the dynamical system is described in detail, as follows. First, following are initializations and the general form of several calculations that are performed by both ends of the system, i.e., at the encoder and decoder.

Initialize $V11(0) = V12(0) = V22(0) = 0$

For $k = 0:K$ $\text{sigma}(k) = \sqrt{(V11(k) - 2*V12(k) + V22(k))}$ $F(k) = \text{sigma}(k)^* \sqrt{P/(P+N)}$ $$\begin{bmatrix} V11(k+1) & V12(k+1) \\ V12(k+1) & V22(k+1) \end{bmatrix} = \begin{bmatrix} A - F(k) & F(k) \\ 0 & A \end{bmatrix}.$$

$$\begin{bmatrix} V11(k) & V12(k) \\ V12(k) & V22(k) \end{bmatrix} \cdot \begin{bmatrix} A - F(k) & F(k) \\ 0 & A \end{bmatrix} + \begin{bmatrix} 0 & 0 \\ 0 & B^2 \end{bmatrix}$$

The quantity sigma(k), as given above, is the norm of (x(k)−s(k)). The matrix $$\begin{bmatrix} V11(k+1) & V12(k+1) \\ V12(k+1) & V22(k+1) \end{bmatrix}$$

is the covariance matrix of the signal vector [s(k), x(k)].

Operations and Calculations Carried Out by the Encoder, at a Transmitter Device, Such as an MTC Device:
1. The encoder receives the state information x(k), which represents the current state of the monitored system.
2. The encoder calculates F(k)=sigma(k)*√P)/(P+N) and G(k)=√P/sigma(k), where sigma(k) is calculated according to the formulation given above. As noted above, G(k) is a gain parameter that accounts for the transmitter power constraint. F(k) may be considered a state update parameter—as seen below, it is used to update the stored state information s(k).
3. The encoder calculates and transmits the message signal z(k)=G(k)*(x(k)−s(k)). In some embodiments, the message z(k) will be represented using a fixed number of bits, e.g., according to a floating point representation, and may be transmitted over a channel using conventional modulation schemes, channel coding, and the like.
4. The encoder creates the signal s(k+1)=A*(s(k)+F(k)*z(k)).
5. The encoder replaces the stored state information s(k) with s(k+1) when an acknowledgment is obtained from the receiver that the transmitted message has been successfully decoded.

Operations and Calculations Carried Out by the Decoder, at a Receiver Device, Such as at a Base Station or at Another MTC Device:
1. The decoder measures the (delayed) output y(k−1) obtained by the signal receiver.
2. The decoder calculates the state update parameter F(k)=sigma(k)*√P/(P+N).
3. The decoder calculates the state estimate x̂(k)=A*(x̂(k−1)+F(k)*y(k−1)).
4. The decoder replaces the stored state estimate x̂(k−1) with the newly computed, most recent, state estimate x̂(k).
5. An acknowledgement is sent from receiver to transmitter when the message has been successfully decoded.

Disclosed above are an algorithm and corresponding encoding and decoding techniques suitable for transmission, e.g., from an MTC device to a receiver device, of a message that encodes the state of a dynamical system. The algorithm, which is non-iterative, is efficient, fast converging, and easy to implement, with a memory at the decoder and decoder that is equal to the size of the state of the system.

Figure 7:
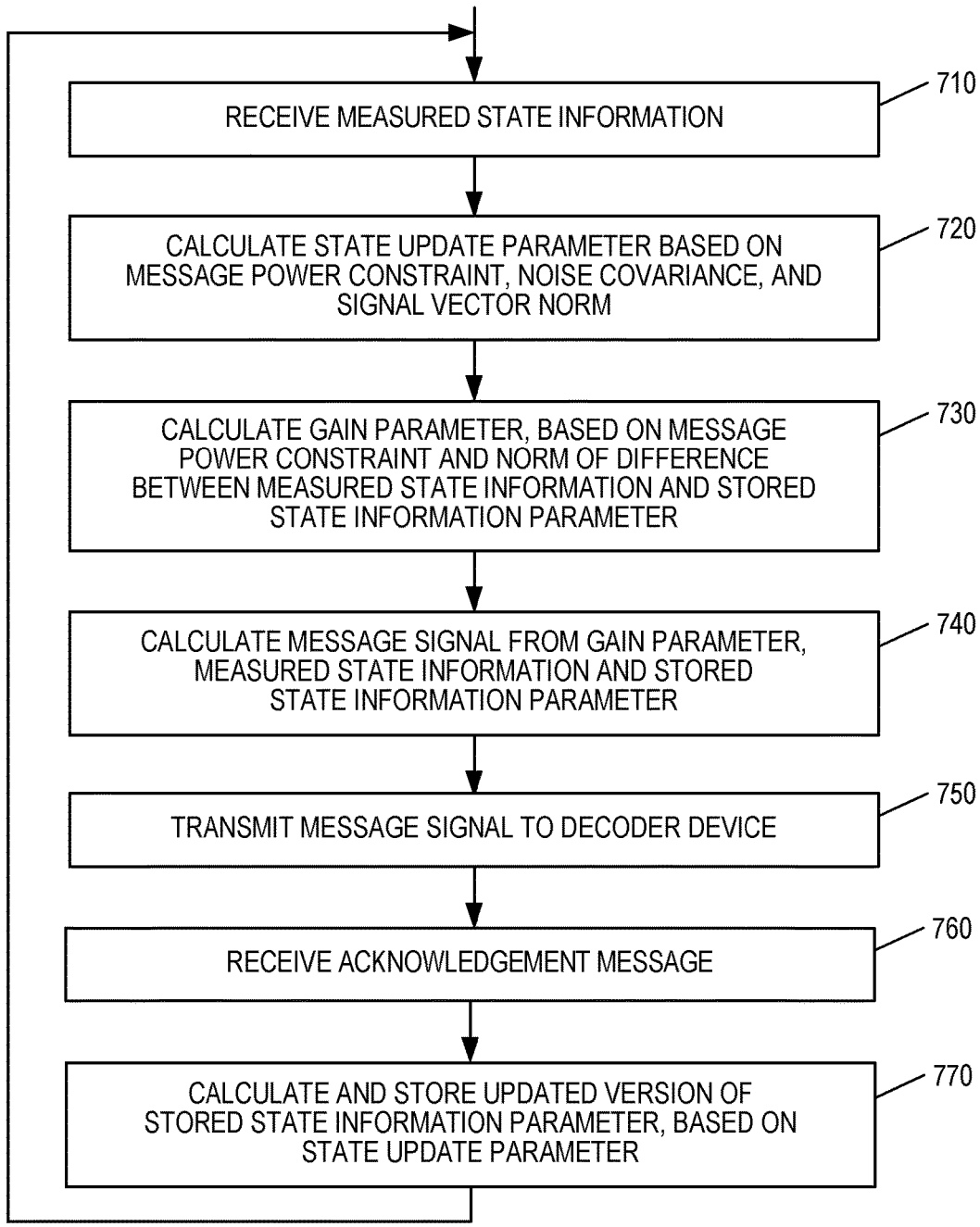
FIG. 7 illustrates an exemplary method and/or procedure performed by an encoding device, according to one or more exemplary embodiments of the present disclosure.
Figure 8:
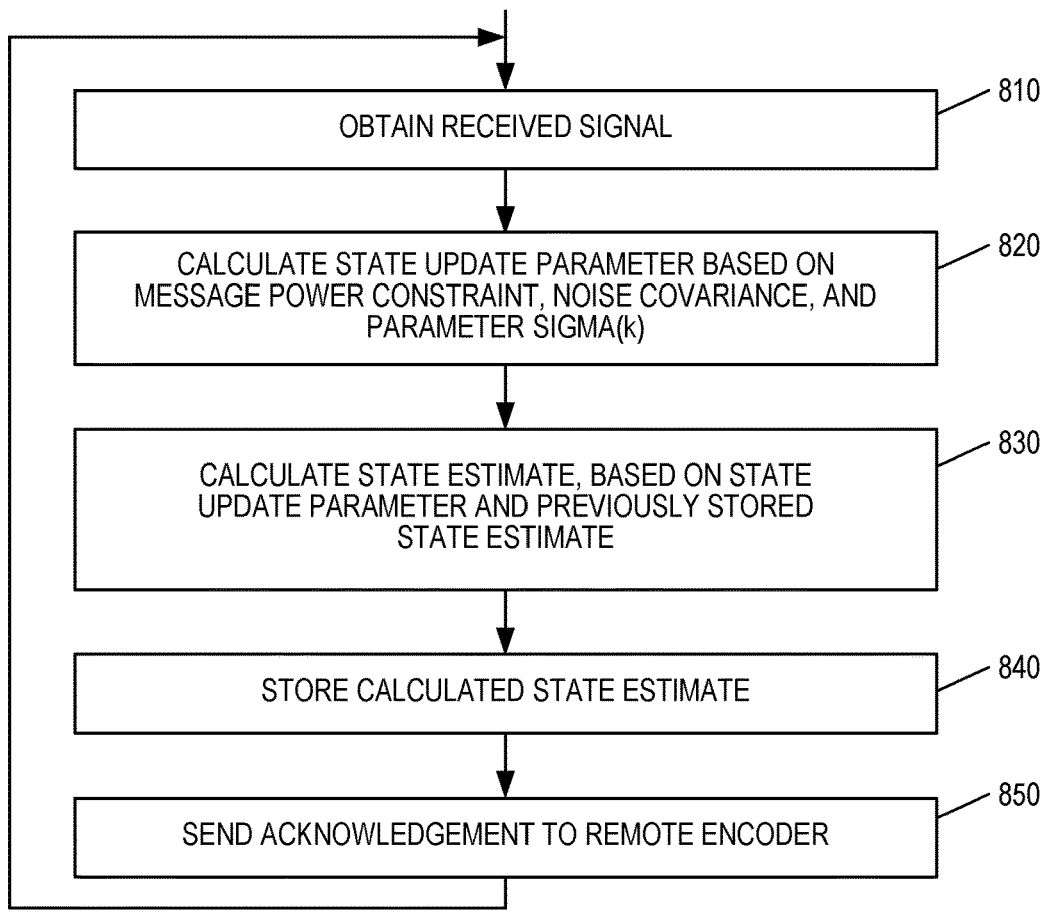
FIG. 8 illustrates an method and/or procedure performed by an decoding device, according to one or more exemplary embodiments of the present disclosure.

FIGS. 7 and 8 are process flow diagrams illustrating example methods corresponding to the disclosed techniques for communicating the state of a monitored dynamical system from an encoding device to a decoder device, as carried out in the encoding device and decoding device, respectively. These processes may be applied where updates to the monitored system's state can be represented according to x(k+1)=A*x(k)+B*w(k), where x(k) is the state of the system, w(k) is the input to the system, and A and B are scalars.

Referring first to FIG. 7, which illustrates a method carried out by an encoding device, block 710 illustrates the receiving of measured state information x(k), the measured state information x(k) representing a first state of the monitored system. The measured state information may be received from sensors located in the same device as the encoder, for example, but may instead (or also) be received from one or more sensors that are external to the device that contains the encoder circuit. In some cases, the measured state information may be received via an intermediate device or circuit, such as via a short-range wireless transmitter.

As seen at block 720, a state update parameter F(k) is calculated, based on a message power constraint P, a covariance N(k) of measurement noise associated with the channel over which encoded state information is to be transmitted, and the norm of the signal vector [s(k), x(k)], where s(k) is a stored state information parameter. As illustrated at block 730, a gain parameter G(k) is also calculated, as a function of the message power constraint P and the norm of the difference of x(k) and s(k). A message signal z(k) is then calculated, according to z(k)=G(k)*(x(k)−s(k)), as shown at block 740, and the message signal z(k) is transmitted to the decoder device, as shown at block 750.

In some embodiments, as shown at block 760, the encoding device receives an acknowledgement message from the remote decoder device, the acknowledgement message indicating that the message signal was received and decoded. It should be understood that this operation is not essential to all embodiments or instances, and may be omitted. As shown at block 770, the encoding device calculates an updated version s(k+1) of the stored state information parameter according to s(k+1)=A*(s(k)+F(k)*z(k)), and stores the updated version s(k+1) of the stored state information parameter in place of the previously stored state information parameter s(k), for use in forming subsequent encoded messages. In some embodiments, the calculating and storing of the updated version of the stored state information parameter is performed in response to receiving the acknowledgement message.

Blocks 710-770 illustrate one iteration of measuring state information for a monitored system, encoding the state information, transmitting the encoded information to a remote decoder device, and storing an updated version of a state information parameter for use in a subsequent update. These operations can be reported, of course, so that changes in the monitored system's state can be tracked by a remote system. Thus, in some embodiments of the method illustrated in FIG. 7, the operation shown in block 710 is repeated, so that second measured state information x(k+1) is received, the second measured state information x(k+1) representing a second state of the monitored system. Likewise, a second state update parameter F(k+1) is calculated, as indicated at block 720, based on the message power constraint P, a second covariance N(k+1) of measurement noise associated with the channel over which encoded state information is to be transmitted, and the norm of the signal vector [s(k+1), x(k+1]. A second gain parameter G(k+1) is also calculated, as shown at block 730, as a function of the message power constraint P and the norm of the difference of x(k+1) and s(k+1). Subsequently, a second message signal z(k+1) is calculated, according to z(k+1)=G(k+1)*(x(k+1)−s(k+1)), and transmitted to the remote decoder device, as shown at blocks 740 and 750. It should be noted that the second covariance N(k+1) and the covariance N(k) may or may not be the same. If an acknowledgement process is being used, another acknowledgement may be received, as shown at block 760; an updated version of the stored state information parameter may also be calculated and stored, as shown at block 770.

As described in detail above, the state update parameter F(k) referenced in block 720 of FIG. 7 may be calculated, in some embodiments, according to F(k)=sigma(k)*√P)/(P+N(k)), where V11(0)=V12(0)=V22(0)=0 and where, for k=0 to a time horizon K:

$$\text{sigma}(k) = \sqrt{(V11(k) - 2^*V12(k) + V22(k))} \text{ and}$$

$$\begin{bmatrix} V11(k+1) & V12(k+1) \\ V12(k+1) & V22(k+1) \end{bmatrix} = \begin{bmatrix} A - F(k) & F(k) \\ 0 & A \end{bmatrix}.$$

$$\begin{bmatrix} V11(k) & V12(k) \\ V12(k) & V22(k) \end{bmatrix} \cdot \begin{bmatrix} A - F(k) & F(k) \\ 0 & A \end{bmatrix} + \begin{bmatrix} 0 & 0 \\ 0 & B^2 \end{bmatrix}.$$

The gain parameter G(k) may be calculated according to $G(k)=\sqrt{P}/\text{sigma}(k)$.

FIG. 8 illustrates a corresponding method, as carried out in a decoder device, for receiving the state of a monitored system from a remote encoding device. Once again, this method is applicable to the monitoring of systems where the monitored system's state can be represented according to $x(k+1)=A*x(k)+B*w(k)$, where $x(k)$ is the state of the system, $w(k)$ is the input to the system, and A and B are scalars As shown at block 810, the illustrated method begins with obtaining a received signal y(k−1). As shown at block 820, a state update parameter F(k) is calculated, based on a message power constraint P, a covariance N(k) of measurement noise associated with the channel over which encoded state information is to be transmitted, and a parameter $\text{sigma}(k)=\sqrt{(V11(k)-2*V12(k)+V22(k))}$, where $V11(0)=V12(0)=V22(0)=0$ and, for k=0 to a time horizon K, $$\text{sigma}(k) = \sqrt{(V11(k) - 2^*V12(k) + V22(k))} \text{ and}$$

$$\begin{bmatrix} V11(k+1) & V12(k+1) \\ V12(k+1) & V22(k+1) \end{bmatrix} = \begin{bmatrix} A - F(k) & F(k) \\ 0 & A \end{bmatrix}.$$

$$\begin{bmatrix} V11(k) & V12(k) \\ V12(k) & V22(k) \end{bmatrix} \cdot \begin{bmatrix} A - F(k) & F(k) \\ 0 & A \end{bmatrix} + \begin{bmatrix} 0 & 0 \\ 0 & B^2 \end{bmatrix};$$

Next, as shown at block 830, a state estimate $\hat{x}(k)$ is calculated, according to $\hat{x}(k)=A*(\hat{x}(k-1)+F(k)*y(k-1))$, where $\hat{x}(k-1)$ is a previously stored state estimate.

If the illustrated method is to be repeated for a subsequent message, the state estimate $\hat{x}(k)$ should then be stored in place of the previously stored state estimate $\hat{x}(k-1)$, as shown at block 840. An acknowledgement may then be sent to the remote encoder device in response to calculating the state estimate $\hat{x}(k)$, as shown at block 850. However, this latter operation is not essential, and thus may be omitted from some embodiments or instances of the illustrated method.

Figure 9:
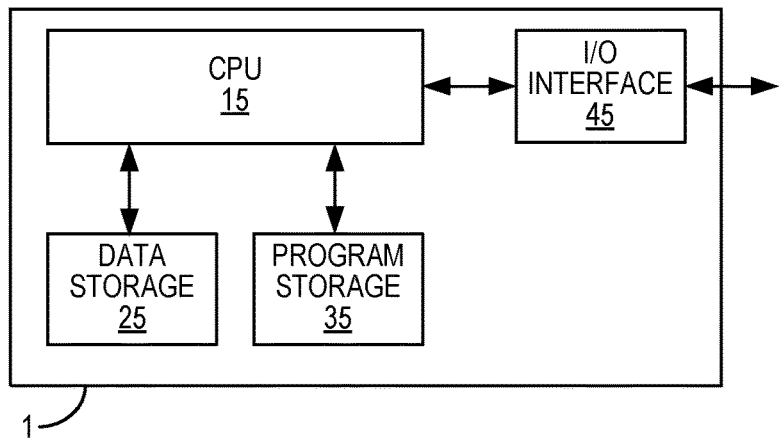
FIG. 9 illustrates an exemplary processing node usable in an MTC device, a UE, and/or a base station, according to one or more exemplary embodiments of the present disclosure.

As discussed above, the decoding or encoding techniques described above, or both, may be implemented in a wireless device, base station, or other node, typically using a programmed processing node. FIG. 9 illustrates an example processing node 1, such as might be found in an MTC device, or in a UE or base station as discussed above. It will be appreciated that the processing circuit of FIG. 9, as detailed below, may correspond in whole or in part to the processing circuits illustrated in FIGS. 2 and 3 and described above.

A computer program for controlling the node 1 to carry out a method embodying any of the presently disclosed techniques is stored in a program storage 35, which comprises one or several memory devices. Data used during the performance of a method embodying the present invention is stored in a data storage 25, which also comprises one or more memory devices. During performance of a method embodying the present invention, program steps are fetched from the program storage 35 and executed by a Central Processing Unit (CPU) 15, retrieving data as required from the data storage 25. Output information resulting from performance of a method embodying the present invention, such as the estimated state information, can be stored back in the data storage 25, or sent to an Input/Output (I/O) interface 45, which may include a network interface for sending and receiving data to and from other network nodes. The CPU 15 and its associated data storage 25 and program storage 25 may collectively be referred to as a "processing circuit." It will be appreciated that variations of this processing circuit are possible, including circuits include one or more of various types of programmable circuit elements, e.g., microprocessors, microcontrollers, digital signal processors, field-programmable application-specific integrated circuits, and the like, as well as processing circuits where all or part of the processing functionality described herein is performed using dedicated digital logic.

Accordingly, in various embodiments of the invention, processing circuits, such as the CPU 15, data storage 25, and program storage 35 in FIG. 9, are configured to carry out one or more of the techniques described in detail above. Of course, it will be appreciated that not all of the steps of these techniques are necessarily performed in a single microprocessor or even in a single module.

Figure 10:
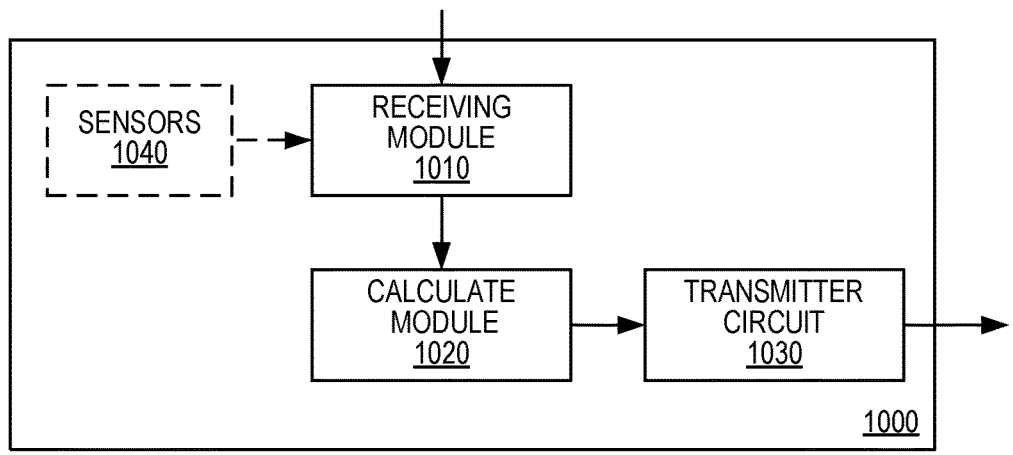
FIG. 10 illustrates an exemplary encoder circuit arranged according to functional modules, according to one or more exemplary embodiments of the present disclosure.
Figure 11:
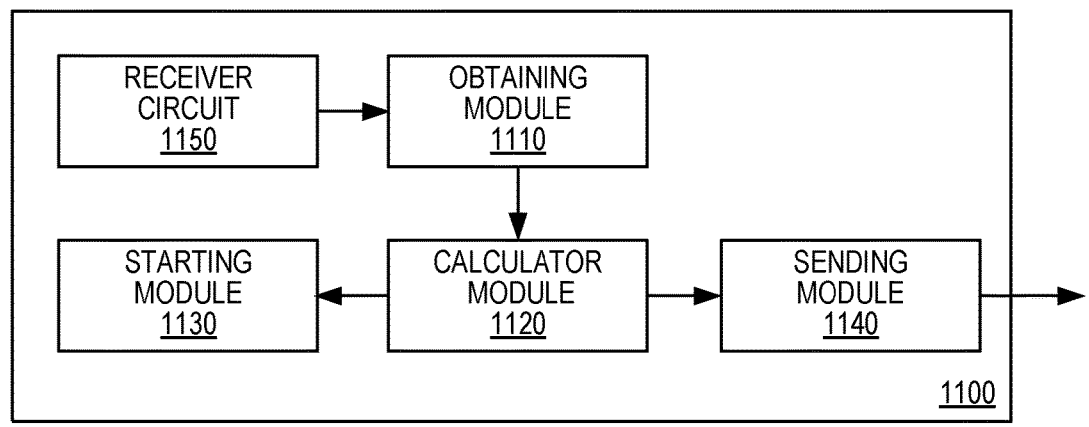
FIG. 11 illustrates an exemplary decoder circuit arranged according to functional modules, according to one or more exemplary embodiments of the present disclosure.

It will further be appreciated that various aspects of the above-described embodiments can be understood as being carried out by functional "modules," which may be program instructions executing on an appropriate processor circuit, hard-coded digital circuitry and/or analog circuitry, or appropriate combinations thereof. FIGS. 10 and 11 thus illustrate an example encoder circuit 1000 and decoder circuit 1100, respectively, where the details of the circuit are represented as functional modules. It will be appreciated that the encoder circuit 1000 and decoder circuit 1100 may be implemented using a hardware architecture similar to that of FIG. 9, in some embodiments.

The encoder circuit 1000 of FIG. 10 includes a receiving module 1010 configured to receive measured state information x(k), the measured state information x(k) representing a first state of the monitored system. The measured state information may be received from sensors 1040 located in the same device as the receiving module 1010, but may instead (or also) be received from one or more sensors that are external to the device that contains the encoder circuit 1000. In some cases, the measured state information may be received via an intermediate device or circuit, such as via a short-range wireless transmitter.

The encoder circuit 1000 further includes a calculator module 1020 configured to calculate a state update parameter F(k), based on a message power constraint P, a covariance N(k) of measurement noise associated with the channel over which encoded state information is to be transmitted, and the norm of the signal vector [s(k), x(k)], where s(k) is a stored state information parameter, to calculate a gain parameter G(k) as a function of the message power constraint P and the norm of the difference of x(k) and s(k), and to calculate a message signal z(k), according to $z(k)=G(k)*(x(k)-s(k))$. In some embodiments, the calculator module 1020 is further configured to send the message signal z(k) to a remote decoder device, via a transmitter circuit 1030.

Similarly, the decoder circuit 1100 of FIG. 11 includes an obtaining module 1110 configured to obtain a received signal y(k−1) and a calculator module 1120. Calculator module 1120 is configured to calculate a state update parameter F(k), based on a message power constraint P, a covariance N(k) of measurement noise associated with the channel over which encoded state information is to be transmitted, and a parameter $\text{sigma}(k)=\sqrt{(V11(k)-2*V12(k)+V22(k))}$, where $V11(0)=V12(0)=V22(0)=0$ and, for k=0 to a time horizon K, $$\text{sigma}(k) = \sqrt{(V11(k) - 2^*V12(k) + V22(k))} \text{ and}$$

$$\begin{bmatrix} V11(k+1) & V12(k+1) \\ V12(k+1) & V22(k+1) \end{bmatrix} = \begin{bmatrix} A - F(k) & F(k) \\ 0 & A \end{bmatrix}.$$

$$\begin{bmatrix} V11(k) & V12(k) \\ V12(k) & V22(k) \end{bmatrix} \cdot \begin{bmatrix} A - F(k) & F(k) \\ 0 & A \end{bmatrix} + \begin{bmatrix} 0 & 0 \\ 0 & B^2 \end{bmatrix}.$$

Calculator module 1120 is further configured to calculate a state estimate $\hat{x}(k)=A*(\hat{x}(k-1)+F(k)*y(k-1))$, where $\hat{x}(k-1)$ is a previously stored state estimate.

Decoder circuit 1100, as illustrated in FIG. 11, further includes a storing module 1130 configured to store the state estimate x̂(k) in place of the previously stored state estimate x̂(k−1). Decoder circuit 1100 may also include a sending module 1140 configured to send an acknowledgement to a remote encoder device in response to calculating the state estimate x̂(k). A receiver circuit 1150 is configured to receive the received signal y(k−1) from a remote encoder device.

It will be appreciated that all of the details and variations discussed above in connection with the process flow diagrams of FIGS. 7 and 8 may apply to various embodiments of the circuits illustrated in FIGS. 9, 10, and 11. It will be further appreciated that a device may include both an encoder circuit and decoder circuit as described above.

Examples of several embodiments of the present techniques have been described in detail above, with reference to the attached illustrations of specific embodiments. Because it is not possible, of course, to describe every conceivable combination of components or techniques, those skilled in the art will appreciate that the present invention can be implemented in other ways than those specifically set forth herein, without departing from essential characteristics of the invention. The present embodiments are thus to be considered in all respects as illustrative and not restrictive.

What is claimed is:

1. A method, in an encoding device, for communicating a sequential plurality of states of a monitored system, the method having a complexity independent of the number of states comprising the plurality, the method comprising:
   receiving measured state information x(k) related to the monitored system;
   calculating a state update parameter F(k), based on:
      the maximum power P available for transmitting a message over a channel;
      a covariance N(k) of measurement noise associated with the channel;
      a stored current state information parameter s(k); and
      the received measured state information x(k);
   calculating a gain parameter G(k) as a function of the maximum power P, the current state information s(k), and the measurement information x(k);
   calculating an encoded message z(k) based on the gain parameter G(k) and the difference between the measurement information x(k) and the current state information s(k); and
   transmitting the encoded message z(k) to the decoder device via the channel; and
   upon receiving an acknowledgement message indicating that the encoded message was successfully received:
      calculating an updated current state information s(k+1) based on the stored current state information s(k), the encoded message z(k), and the state update parameter F(k); and
      storing the updated current state information s(k+1) as the current state information s(k).

2. The method of claim 1, wherein the state update parameter F(k) is calculated based on the norm of the vector [s(k), x(k)], and the gain parameter is calculated based on the norm of the difference of x(k) and s(k).

3. The method of claim 1, wherein the message z(k) is calculated according to z(k)=G(k)*(x(k)−s(k)).

4. The method of claim 1, further comprising subsequently:
   receiving second measured state information x(k+1), the second measured state information x(k+1) representing a second state of the monitored system;
   calculating a second state update parameter F(k+1), based on:
      the maximum power P;
      a second covariance N(k+1) of measurement noise associated with the channel;
      the stored current state information parameter s(k+1); and
      the received second measured state information x(k+1);
   calculating a second gain parameter G(k+1) as a function of the maximum power P, the stored current state information s(k+1), and the received second measurement information x(k+1);
   calculating a second encoded message z(k+1) based on the gain parameter G(k) and the difference between the measurement information x(k) and the current state information s(k); and
   transmitting the second message signal z(k+1) to the decoder device via the channel.

5. The method of claim 4, wherein the second covariance N(k+1) and the covariance N(k) are the same, the state update parameter F(k+1) is calculated based on the norm of the vector [s(k+1), x(k+1)], and the gain parameter G(k+1) is calculated based on the norm of the difference of x(k+1) and s(k+1).

6. The method of claim 1, wherein the state update parameter F(k) is calculated according to F(k)=sigma(k)*√P)/(P+N(k)), where V11(0)=V12(0)=V22(0)=0 and where, for k=0 to a time horizon K:

$$\text{sigma}(k) = \sqrt{(V11(k) - 2^*V12(k) + V22(k))} \text{ and}$$

$$\begin{bmatrix} V11(k+1) & V12(k+1) \\ V12(k+1) & V22(k+1) \end{bmatrix} = \begin{bmatrix} A - F(k) & F(k) \\ 0 & A \end{bmatrix} \cdot$$

$$\begin{bmatrix} V11(k) & V12(k) \\ V12(k) & V22(k) \end{bmatrix} \cdot \begin{bmatrix} A - F(k) & F(k) \\ 0 & A \end{bmatrix} + \begin{bmatrix} 0 & 0 \\ 0 & B^2 \end{bmatrix}$$

wherein updates to the monitored system's state can be represented according to x(k+1)=A*x(k)+B*w(k), w(k) is an input to the system, and A and B are scalars.

7. The method of claim 6, wherein the gain parameter G(k) is calculated according to G(k)=√P/sigma(k).

8. A method, in a decoder device, for receiving a sequential plurality of states of a monitored system from a remote encoding device, the method having a complexity independent of the number of states comprising the plurality, the method comprising:
   obtaining a received signal y(k−1) representative of an encoded message z(k) transmitted by the encoding device via a channel;
   calculating a state update parameter F(k), based on:
      the maximum power P available for transmitting a message over the channel;
      a covariance N(k) of measurement noise associated with the channel;
      scalar parameters A and B representing the monitored system; and
      a time horizon K for monitoring the system;
   calculating a state estimate x̂(k) of the state of the system x(k) based on the state update parameter F(k), the received signal y(k−1), and a previously stored state estimate x̂(k−1);
   sending an acknowledgement to the remote encoder device in response to calculating the state estimate x̂(k); and
   storing the state estimate x̂(k) in place of the previously stored state estimate x̂(k−1).

9. The method of claim 8, wherein the state update parameter F(k) is calculated based on a parameter sigma(k)=$\sqrt{(V11(k)-2*V12(k)+V22(k))}$, where V11(0)=V12(0)=V22(0)=0 and, for k=0 to the time horizon K, $$sigma(k) = \sqrt{(V11(k) - 2^*V12(k) + V22(k))} \text{ and}$$

$$\begin{bmatrix} V11(k+1) & V12(k+1) \\ V12(k+1) & V22(k+1) \end{bmatrix} = \begin{bmatrix} A-F(k) & F(k) \\ 0 & A \end{bmatrix}.$$

$$\begin{bmatrix} V11(k) & V12(k) \\ V12(k) & V22(k) \end{bmatrix} \cdot \begin{bmatrix} A-F(k) & F(k) \\ 0 & A \end{bmatrix} + \begin{bmatrix} 0 & 0 \\ 0 & B^2 \end{bmatrix}.$$

10. The method of claim 8, wherein the state estimate x̂(k) is calculated according to $A^*(\hat{x}(k-1)+F(k)^*y(k-1))$.

11. An encoder circuit for encoding a sequential plurality of states of a monitored system, the encoding having a complexity independent of the number of states comprising the plurality, the encoder circuit comprising a processor and a memory device, wherein the encoder circuit is configured, with the processor executing program code stored in the memory device, to:
  receive measured state information x(k), related to the monitored system;
  calculate a state update parameter F(k), based on:
    the maximum power P available for transmitting a message over a channel;
    a covariance N(k) of measurement noise associated with the channel;
    a stored current state information parameter s(k); and
    the received measured state information x(k);
  calculate a gain parameter G(k) as a function of the maximum power P, the current state information s(k), and the measurement information x(k); and
  calculate an encoded message z(k) based on the gain parameter G(k) and the difference between the measurement information x(k) and the current state information s(k).

12. The encoder circuit of claim 11, wherein the encoder circuit is further configured to calculate the state update parameter F(k) based on the norm of the vector [s(k), x(k)], and to calculate the gain parameter based on the norm of the difference of x(k) and s(k).

13. The encoder circuit of claim 11, wherein the encoder circuit is configured to calculate the message z(k) according to $z(k)=G(k)^*(x(k)-s(k))$.

14. The encoder circuit of claim 11, wherein the encoder circuit is further configured to subsequently:
  receive second measured state information x(k+1), the second measured state information x(k+1) representing a second state of the monitored system;
  calculate a second state update parameter F(k+1), based on:
    the maximum power P; and
    a second covariance N(k+1) of measurement noise associated with the channel;
  calculate a second gain parameter G(k+1) as a function of the maximum power P, the stored current state information s(k+1), and the received second measurement information x(k+1); and
  calculate a second encoded message z(k+1) based on the gain parameter G(k) and the difference between the measurement information x(k) and the current state information s(k).

15. The encoder circuit of claim 14, wherein the second covariance N(k+1) and the covariance N(k) are the same, and wherein the encoder circuit is further configured to calculate the state update parameter based on the norm of the vector [s(k+1), x(k+1)] and to calculate the gain parameter G(k+1) based on the norm of the difference of x(k+1) and s(k+1).

16. The encoder circuit of claim 11, wherein the encoder circuit is configured to calculate the state update parameter F(k) according to $F(k)=sigma(k)^*\sqrt{P}/(P+N(k))$, where V11(0)=V12(0)=V22(0)=0 and, for k=0 to a time horizon K:

$$sigma(k) = \sqrt{(V11(k) - 2^*V12(k) + V22(k))} \text{ and}$$

$$\begin{bmatrix} V11(k+1) & V12(k+1) \\ V12(k+1) & V22(k+1) \end{bmatrix} = \begin{bmatrix} A-F(k) & F(k) \\ 0 & A \end{bmatrix}.$$

$$\begin{bmatrix} V11(k) & V12(k) \\ V12(k) & V22(k) \end{bmatrix} \cdot \begin{bmatrix} A-F(k) & F(k) \\ 0 & A \end{bmatrix} + \begin{bmatrix} 0 & 0 \\ 0 & B^2 \end{bmatrix}$$

wherein updates to the monitored system's state can be represented according to $x(k+1)=A^*x(k)+B^*w(k)$, and wherein w(k) is an input to the system, and wherein A and B are scalars.

17. The encoder circuit of claim 16, wherein the encoder circuit is configured to calculate the gain parameter G(k) according to $G(k)=\sqrt{P}/sigma(k)$.

18. A transmitter device comprising the encoder circuit of claim 11 and further comprising a transmitter circuit configured to transmit the encoded message z(k) to the decoder device.

19. A decoder circuit for receiving a sequential plurality of states of a monitored system, the decoder circuit comprising a processor and a memory device, wherein the decoder circuit is configured, with the processor executing program code stored in the memory device, to:
  obtain a received signal y(k−1) representative of an encoded message z(k) transmitted by the encoding device via a channel;
  calculate a state update parameter F(k), based on:
    the maximum power P available for transmitting a message over the channel;
    a covariance N(k) of measurement noise associated with the channel;
    scalar parameters A and B representing the monitored system; and
    a time horizon K for monitoring the system;
  calculate a state estimate x̂(k) of the state of the system x(k) based on the state update parameter F(k), the received signal y(k−1), and a previously stored state estimate x̂(k−1);
  send an acknowledgement in response to calculating the state estimate x̂(k); and
  store the state estimate x̂(k) in place of the previously stored state estimate x̂(k−1).

20. The decoder circuit of claim 19, wherein the decoder circuit is further configured to calculate the state update parameter F(k) based on a parameter sigma(k)=$\sqrt{(V11(k)-2*V12(k)+V22(k))}$, where V11(0)=V12(0)=V22(0)=0 and, for k=0 to the time horizon K, $$sigma(k) = \sqrt{(V11(k) - 2^*V12(k) + V22(k))} \text{ and}$$

$$\begin{bmatrix} V11(k+1) & V12(k+1) \\ V12(k+1) & V22(k+1) \end{bmatrix} = \begin{bmatrix} A-F(k) & F(k) \\ 0 & A \end{bmatrix}.$$

$$\begin{bmatrix} V11(k) & V12(k) \\ V12(k) & V22(k) \end{bmatrix} \cdot \begin{bmatrix} A-F(k) & F(k) \\ 0 & A \end{bmatrix} + \begin{bmatrix} 0 & 0 \\ 0 & B^2 \end{bmatrix}.$$

21. The decoder circuit of claim 19, wherein the decoder circuit is further configured to calculate the state estimate x̂(k) according to $A^*(\hat{x}(k-1)+F(k)^*y(k-1))$.

22. A receiver device comprising the decoder circuit of claim 19 and further comprising a receiver circuit configured to receive the received signal y(k−1) from a remote encoder device.

23. A machine-type-communication device comprising the decoder circuit of claim 19 and further comprising:
- an encoder circuit for encoding a sequential plurality of states of a monitored system, the encoding having a complexity independent of the number of states comprising the plurality, the encoder circuit comprising a processor and a memory device, wherein the encoder circuit is configured, with execution of program code stored in the memory device, to:
  - receive measured state information x(k), related to the monitored system;
  - calculate a state update parameter F(k), based on:
    - the maximum power P available for transmitting a message over a channel;
    - a covariance N(k) of measurement noise associated with the channel;
    - a stored current state information parameter s(k); and
    - the received measured state information x(k);
  - calculate a gain parameter G(k) as a function of the maximum power P, the current state information s(k), and the measurement information x(k); and
  - calculate an encoded message z(k) based on the gain parameter G(k) and the difference between the measurement information x(k) and the current state information s(k).

24. A non-transitory computer-readable medium comprising, stored thereupon, a computer program product for communicating a sequential plurality of states of a monitored system according to a complexity independent of the number of states comprising the plurality, the computer program product comprising instructions for:
- receiving measured state information x(k) related to the monitored system;
- calculating a state update parameter F(k), based on:
  - the maximum power P available for transmitting a message over a channel;
  - a covariance N(k) of measurement noise associated with the channel;
  - a stored current state information parameter s(k); and
  - the received measured state information x(k);
- calculating a gain parameter G(k) as a function of the maximum power P, the current state information s(k), and the measurement information x(k);
- calculating an encoded message z(k) based on the gain parameter G(k) and the difference between the measurement information x(k) and the current state information s(k); and
- transmitting the encoded message z(k) to the decoder device via the channel; and
- upon receiving an acknowledgement message indicating that the encoded message was successfully removed:
  - calculating an updated current state information s(k+1) based on the stored current state information s(k), the encoded message z(k), and the state update parameter F(k); and
  - storing the updated current state information s(k+1) as the current state information s(k).

25. A non-transitory computer-readable medium comprising, stored thereupon, a computer program product for receiving a sequential plurality of states of a monitored system from a remote encoding device according to a complexity independent of the number of states comprising the plurality, the computer program product comprising instructions for:
- obtaining a received signal y(k−1) representative of an encoded message z(k) transmitted by the encoding device via a channel;
- calculating a state update parameter F(k), based on:
- the maximum power P available for transmitting a message over the channel;
- a covariance N(k) of measurement noise associated with the channel;
- scalar parameters A and B representing the monitored system; and
- a time horizon K for monitoring the system;
- calculating a state estimate $\hat{x}(k)$ of the state of the system x(k) based on the state update parameter F(k), the received signal y(k−1), and a previously stored state estimate $\hat{x}(k-1)$;
- sending an acknowledgement to the remote encoder device in response to calculating the state estimate $\hat{x}(k)$; and
- storing the state estimate $\hat{x}(k)$ in place of the previously stored state estimate $\hat{x}(k-1)$.

* * * * *